(12) United States Patent
Pandey et al.

(10) Patent No.: US 11,532,463 B2
(45) Date of Patent: Dec. 20, 2022

(54) SEMICONDUCTOR PROCESSING CHAMBER AND METHODS FOR CLEANING THE SAME

(71) Applicant: Applied Materials, Inc., Santa Clara, CA (US)

(72) Inventors: Vishwas Kumar Pandey, Ujjain (IN); Vinay K. Prabhakar, Cupertino, CA (US); Bushra Afzal, Saratoga, CA (US); Badri N. Ramamurthi, Los Gatos, CA (US); Juan Carlos Rocha-Alvarez, San Carlos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 259 days.

(21) Appl. No.: 16/936,071

(22) Filed: Jul. 22, 2020

(65) Prior Publication Data

US 2021/0035781 A1 Feb. 4, 2021

Related U.S. Application Data

(60) Provisional application No. 62/879,714, filed on Jul. 29, 2019.

(51) Int. Cl.
| | |
|---|---|
| *H01J 37/32* | (2006.01) |
| *C23C 16/44* | (2006.01) |
| *B08B 7/00* | (2006.01) |

(52) U.S. Cl.
CPC ...... *H01J 37/32623* (2013.01); *B08B 7/0035* (2013.01); *C23C 16/4405* (2013.01);
(Continued)

(58) Field of Classification Search
CPC ........... H01J 37/32623; H01J 37/32449; H01J 2237/022; H01J 2237/335; B08B 7/0035; C23C 16/4405
See application file for complete search history.

(56) References Cited

U.S. PATENT DOCUMENTS

| | | | |
|---|---|---|---|
| 6,106,625 A | 8/2000 | Koai et al. | |
| 2004/0149386 A1* | 8/2004 | Numasawa | ......... C23C 16/5096 |
| | | | 156/345.43 |

(Continued)

FOREIGN PATENT DOCUMENTS

| | | |
|---|---|---|
| EP | 0875919 A2 | 11/1998 |
| TW | 2014-06982 A | 2/2014 |

(Continued)

OTHER PUBLICATIONS

Machine translation of TW-202145290-A (Year: 2021).*

(Continued)

*Primary Examiner* — Erin F Bergner
(74) *Attorney, Agent, or Firm* — Kilpatrick Townsend & Stockton LLP

(57) ABSTRACT

A processing chamber may include a gas distribution member, a metal ring member below the gas distribution member, and an isolating assembly coupled with the metal ring member and isolating the metal ring member from the gas distribution member. The isolating assembly may include an outer isolating member coupled with the metal ring member. The outer isolating member may at least in part define a chamber wall. The isolating assembly may further include an inner isolating member coupled with the outer isolating member. The inner isolating member may be disposed radially inward from the metal ring member about an central axis of the processing chamber. The inner isolating member may define a plurality of openings configured to provide fluid access into a radial gap between the metal ring member and the inner isolating member.

12 Claims, 9 Drawing Sheets

(52) U.S. Cl.
CPC ... *H01J 37/32449* (2013.01); *H01J 2237/022* (2013.01); *H01J 2237/335* (2013.01)

(56) References Cited

U.S. PATENT DOCUMENTS

| | | | |
|---|---|---|---|
| 2005/0221552 A1* | 10/2005 | Kao | H01L 21/02104 438/200 |
| 2007/0131168 A1* | 6/2007 | Gomi | H01J 37/3244 118/715 |
| 2019/0131115 A1 | 5/2019 | Gu et al. | |
| 2019/0131159 A1 | 5/2019 | Melikyan et al. | |

FOREIGN PATENT DOCUMENTS

| | | | |
|---|---|---|---|
| TW | 202145290 A | * | 12/2021 |
| WO | 2018-183245 A1 | | 10/2018 |

OTHER PUBLICATIONS

International Preliminary Report on Patentability dated Feb. 10, 2022 in International Patent Application No. PCT/US2020/043082, 5 pages.

International Search Report and Written Opinion dated Oct. 30, 2020 in International Patent Application No. PCT/US2020/043082, all pages.

\* cited by examiner

SEMICONDUCTOR PROCESSING CHAMBER AND METHODS FOR CLEANING THE SAME

CROSS-REFERENCE TO RELATED APPLICATIONS

The present application claims the benefit of, and priority to U.S. Provisional Patent Application No. 62/879,714, filed Jul. 29, 2019, the contents of which are hereby incorporated by reference in their entirety for all purposes.

TECHNICAL FIELD

The present technology relates to semiconductor processes and equipment. More specifically, the present technology relates to semiconductor processing chambers and methods for cleaning the same.

BACKGROUND

Integrated circuits are made possible by processes which produce intricately patterned material layers on substrate surfaces. As device sizes continue to shrink in next-generation devices, uniformity of processing conditions continues to increase in importance, chamber designs and system set-up may have an important role in the quality of devices produced. Thus, there is a need for systems and methods that can be used to produce high quality devices and structures.

SUMMARY

According to one aspect, a processing chamber may include a gas distribution member, a metal ring member below the gas distribution member, and an isolating assembly coupled with the metal ring member and isolating the metal ring member from the gas distribution member. The isolating assembly may include an outer isolating member and an inner isolating member. The outer isolating member may be coupled with the metal ring member. The outer isolating member may at least in part define a chamber wall. The inner isolating member may be coupled with the outer isolating member. The inner isolating member may be disposed radially inward from the metal ring member about an central axis of the processing chamber. The inner isolating member may define a plurality of openings configured to provide fluid access into a radial gap between the metal ring member and the inner isolating member.

In some embodiments, a portion of the inner isolating member may be radially aligned with the metal ring member.

In some embodiments, the inner isolating member may include a first inner isolating component and a second inner isolating component. The first inner isolating component may be coupled with the outer isolating member. The second inner isolating component may be coupled with the first inner isolating component and coaxially aligned with the first inner isolating component. The second inner isolating component may be axially offset from the first inner isolating component and may be disposed radially inward from the first inner isolating component to define the plurality of openings.

In some embodiments, the plurality of openings comprise a plurality of circumferential gaps. The first inner isolating component may include a first cylindrical wall and a plurality of first arms extending radially inward from a bottom portion of the first cylindrical wall. The second inner isolating component may include a second cylindrical wall and a plurality of second arms extending radially outward from a top portion of the second cylindrical wall. The plurality of second arms may be coupled with the plurality of first arms. The plurality of circumferential gaps may be defined between the coupled plurality of first and second arms.

In some embodiments, the second inner isolating component may further include a lip extending radially inward from a bottom portion of the second cylindrical wall. The lip may be configured to support an edge ring of a substrate support of the processing chamber.

In some embodiments, an angle of each opening of the plurality of openings may be greater than or about 5°. In some embodiments, the outer isolating member may include an isolating ring coaxially aligned with the metal ring member about the central axis of the processing chamber. In some embodiments, the gas distribution member, the metal ring member, and the isolating assembly may be coaxially aligned about the central axis of the processing chamber.

According to another aspect, an isolating assembly may include an annular outer isolating member and an inner isolating member. The annular outer isolating member may be disposed about a central axis of the isolating assembly. The inner isolating member may be coaxially aligned with the annular outer isolating member about the central axis. The inner isolating member may include a first isolating component and a second isolating component. The first isolating component may include a first cylindrical wall and a plurality of first arms extending radially inward from a lower portion of the first cylindrical wall. The second isolating component may include a second cylindrical wall coaxially aligned with the first cylindrical wall and axially offset from the first cylindrical wall. The second isolating component may further include a plurality of second arms extending radially outward from an upper portion of the second cylindrical wall. The plurality of second arms may be coupled with the plurality of first arms. A plurality circumferential gaps may be defined between the coupled plurality of first and second arms.

In some embodiments, each of the plurality of first arms may be disposed at an equal distance from two adjacent first arms, and each of the plurality of second arms may be disposed at an equal distance from two adjacent second arms. In some embodiments, a number of the plurality of first arms and a number of the plurality of second arms may be equal. In some embodiments, at least one of the annular outer isolating member, the first isolating component, or the second isolating component may include a ceramic material.

According to a further aspect, a method may include flowing a cleaning gas into a processing volume of a processing chamber. The processing chamber may include a gas distribution member, a metal ring member, and an isolating assembly isolating the metal ring member from the gas distribution member. The cleaning gas may be flowed into the processing volume from the gas distribution member. The method may further include maintaining a substrate support of the processing chamber at a first position inside the processing volume. The substrate support may be positioned above a plurality of openings defined by the isolating assembly. The method may also include flowing the cleaning gas through the plurality of openings towards the metal ring member.

In some embodiments, the method may further include maintaining the substrate support at a second position inside the processing volume below the plurality of openings. The method may also include flowing the cleaning gas through the plurality of openings while the substrate support may be maintained at the second position. In some embodiments, the method may further include maintaining the substrate support at a third position inside the processing volume below the second position while flowing the cleaning gas into the processing volume.

In some embodiments, the isolating assembly may include an outer isolating member and an inner isolating member. The outer isolating member may be coupled with the metal ring member. The inner isolating member may be coupled with the outer isolating member. The inner isolating member may be disposed radially inward from the metal ring member about an central axis of the processing chamber. The inner isolating member may define the plurality of openings to provide fluid access into a radial gap between the metal ring member and the inner isolating member.

In some embodiments, the inner isolating member may include a first inner isolating component and a second inner isolating component. The first inner isolating component may be coupled with the outer isolating member. The second inner isolating component may be coupled with the first inner isolating component and coaxially aligned with the first inner isolating component. The second inner isolating component may be axially offset from the first inner isolating component and may be disposed radially inward from the first inner isolating component to define the plurality of openings.

In some embodiments, the plurality of openings may include a plurality of circumferential gaps. The first inner isolating component may include a first cylindrical wall and a plurality of first arms extending radially inward from a bottom portion of the first cylindrical wall. The second inner isolating component may include a second cylindrical wall and a plurality of second arms extending radially outward from a top portion of the second cylindrical wall. The plurality of second arms may be coupled with the plurality of first arms. The plurality of circumferential gaps may be defined between the coupled plurality of first and second arms.

In some embodiments, the method may further include forming a plasma inside the processing chamber, and shielding the metal ring member from the plasma with the isolating assembly. In some embodiments, a portion of the isolating assembly may be radially aligned with the metal ring member to shield the metal ring member from a plasma.

The present technology may provide numerous benefits over conventional systems and techniques. For example, the present technology may shield chamber components from plasma damage while providing fluid access for a cleaning gas to efficiently clean the chamber components shielded from the plasma. These and other embodiments, along with many of their advantages and features, may be described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

During manufacturing of semiconductor devices, materials may be deposited on a semiconductor substrate housed in a processing chamber using plasma. The plasma may be generated in the processing chamber, exposing various chamber components to the plasma, which may include a metal ring member and adjacent isolating members. Plasma arc marks have been observed between the metal ring member and the adjacent isolating members, causing damage to the metal ring member and/or the adjacent isolating members and shortening the part life of the exposed components as some of the isolating members may crack frequently at the operating temperature during deposition, e.g., at about 250° C.

The present technology overcome these issues by providing an inner isolating member. At least a portion of the inner isolating member may be radially aligned with the metal ring member, and thus may shield the metal ring member from the plasma. Further, the inner isolating member may utilize a two-piece design to create gaps for a cleaning gas to access the metal ring member and/or an outer isolating member so as to remove any material deposition that may be accumulated on the these chamber components over time to prevent particles from being released by the metal ring member and/or the inner and outer isolating members.

Although the remaining disclosure will routinely identify cleaning of components of a processing chamber utilizing the disclosed technology, the technology should not be considered to be so limited as for cleaning process only. The present technology can be utilized for other processes, including but not limited to deposition, etching, etc. Moreover, although exemplary semiconductor processing chambers are described to aid understanding of the present technology, the technology should not be considered to be so limited as for cleaning and/or shielding components of semiconductor processing chambers only or to the exemplary chamber described. It is to be understood that the present technology can be utilized for any type of processing chamber.

Figure 1:
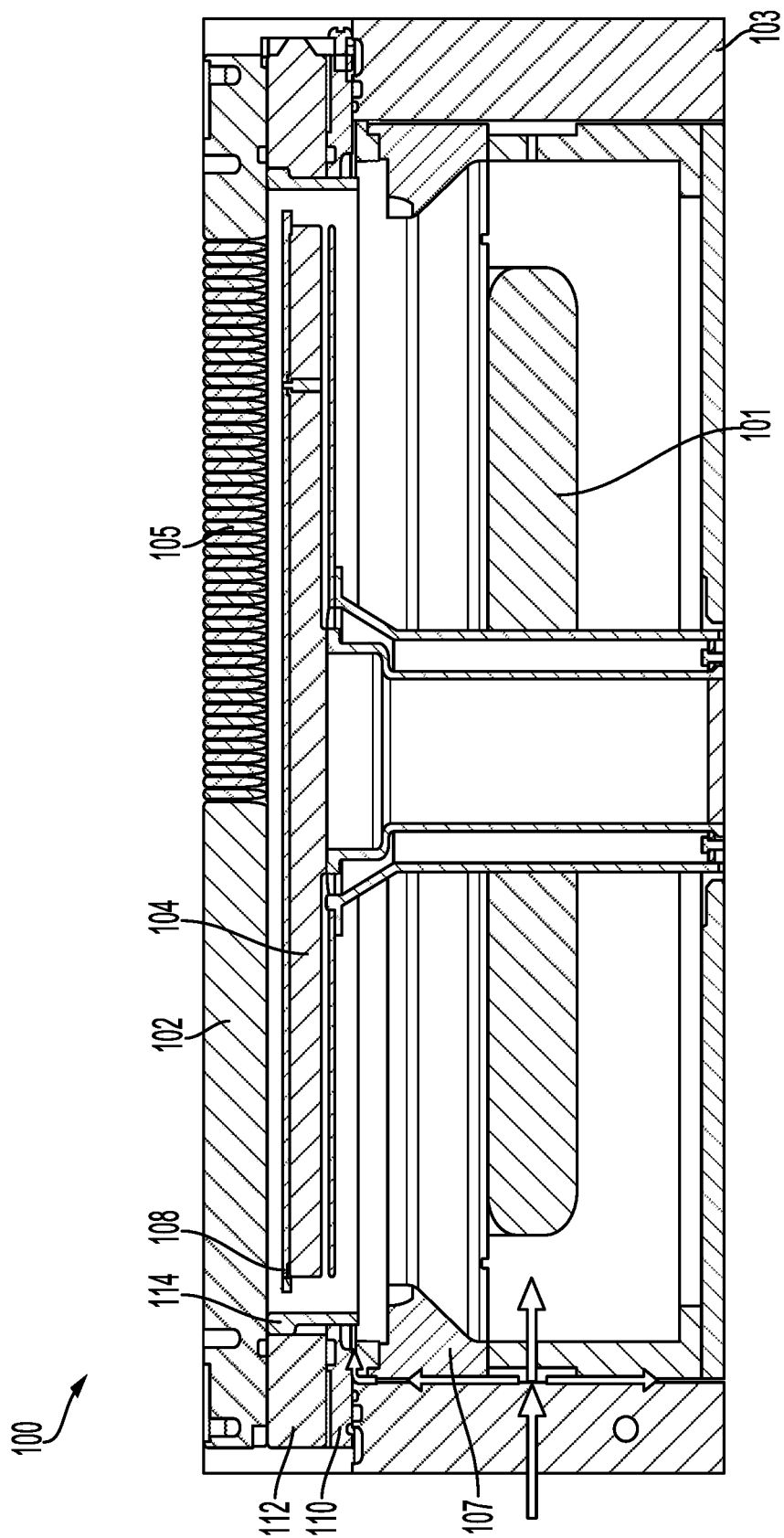
FIG. 1 shows a schematic cross-sectional view of an exemplary processing chamber according to embodiments of the present technology.

FIG. 1 shows a schematic cross-sectional view of an exemplary processing chamber 100. The processing chamber 100 may have a chamber volume 101 defined at least in part by a gas distribution member or showerhead 102 and a chamber body 103. The gas distribution member 102 may include a number of apertures 105 configured to provide fluid access into the chamber volume 101. The processing chamber 100 may further include a substrate support 104 positioned below the gas distribution member 102 inside the chamber volume 101. The substrate support 104 may be moved up and down inside the chamber volume 101 relative to the gas distribution member 102 along a central axis of the chamber volume 101, which may also be the central axis of the substrate support 104.

The distance between the gas distribution member 102 and the substrate support 104 may vary depending on the process being performed in the processing chamber 100. For example, during a deposition process, the substrate support 104 may be moved upward and may be relatively close to the gas distribution member 102 as shown in FIG. 1. During a cleaning process, the substrate support 104 may be moved downward away from the substrate support 104. As will be discussed in more detail below, depending on the cleaning scheme implemented, the substrate support 104 may be moved to various positions and maintained in the respective positions to clean the various components of the processing chamber 100.

The substrate support 104 may include an edge ring 108 disposed around a peripheral or radial edge of a top surface of the substrate support 104. The edge ring 108 may be raised relatively to a central region of the top surface of the substrate support 104 where a substrate or semiconductor wafer may be supported during processing. The edge ring 108 may have a thickness similar to the wafer thickness such that the top surface of the edge ring 108 may be level with the surface of the substrate or wafer. The edge ring 108 may extend radially beyond the radial edge of the top surface of the substrate support 104 to increase the residence time of the process gas. In some embodiments, when the substrate support 104 may be moved downward away from the gas distribution member 102 and below a stepped liner 107 disposed radially outward from the substrate support 104, the edge ring 108 may be lift off from the substrate support 104 by the stepped liner 107 and may be supported by an inner peripheral region of the top surface of the stepped liner 107.

With continued reference to FIG. 1, the processing chamber 100 may further include a metal ring member 110, an outer isolating member 112, and an inner isolating member 114. The metal ring member 110 may be disposed above and/or supported by the stepped liner 107, and may be or include an aluminum ring member. The outer isolating member 112 may be disposed above and/or supported by the metal ring member 110. The outer isolating member 112 may be or include an insulating ring member, such as a ceramic ring member. The inner isolating member 114 may be coupled with and/or supported by the outer isolating member 112, and may be disposed radially inward from the outer isolating member 112 and/or the metal ring member 110. The inner isolating member 114 may be or include an insulating ring member, such as a ceramic ring member. The outer isolating member 112 and the inner isolating member 114 may be collectively referred to as an isolating assembly. The outer isolating member 112 and the inner isolating member 114 may be configured to electrically isolate or insulate the metal ring member 110 from other chamber components of the processing chamber 100, such as the gas distribution member 102.

As discussed above, in conventional chamber designs, the metal ring member 110 may be exposed to plasma during deposition and/or cleaning processes and may be damaged by the plasma. In the embodiment shown in FIG. 1, the inner isolating member 114 may extend axially downward below the metal ring member 110. Thus, the metal ring member 110 may be shielded from the plasma by the inner isolating member 114, reducing or preventing damage to the metal ring member 110 that may be otherwise created due to exposure to and/or direct contact with plasma. However, the inner isolating member 114 may also limit the cleaning gas that may reach the metal ring member 110 during the cleaning process. Thus, to clean the metal ring member 110, e.g., to remove material deposition accumulated on the metal ring member 110 over time, a long cleaning cycle may be needed, which may affect production throughput. Further, any unremoved material deposition due to limited exposure to the cleaning gas may cause particles to be released from the metal ring member 110 during deposition, which may affect the quality of the device produced. In some embodiments, a flat liner, instead of the stepped liner 107, may be utilized. However, improvement in the cleaning gas flow reaching the metal ring member 110 may be limited, and the cleaning time may still be significant.

Figure 2A:
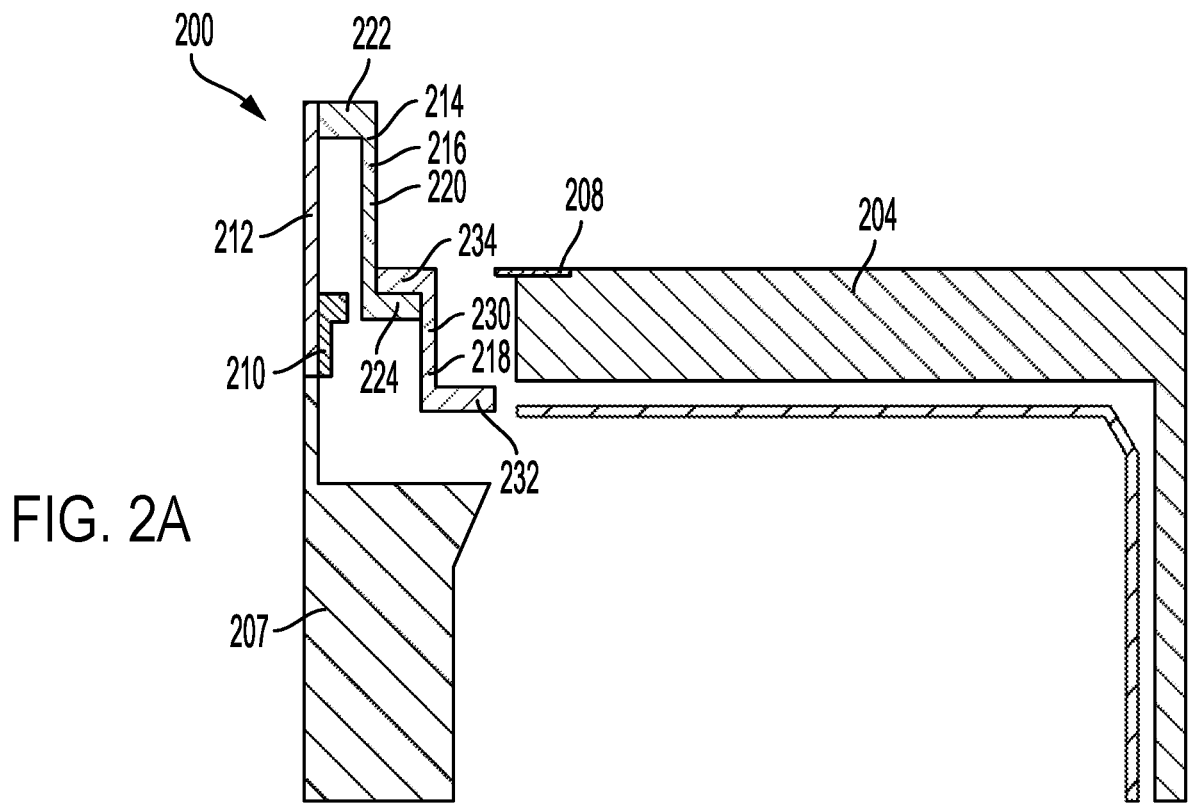
FIG. 2A schematically illustrates a partial cross-sectional view of select chamber components of an exemplary processing chamber according to embodiments of the present technology.
Figure 2B:
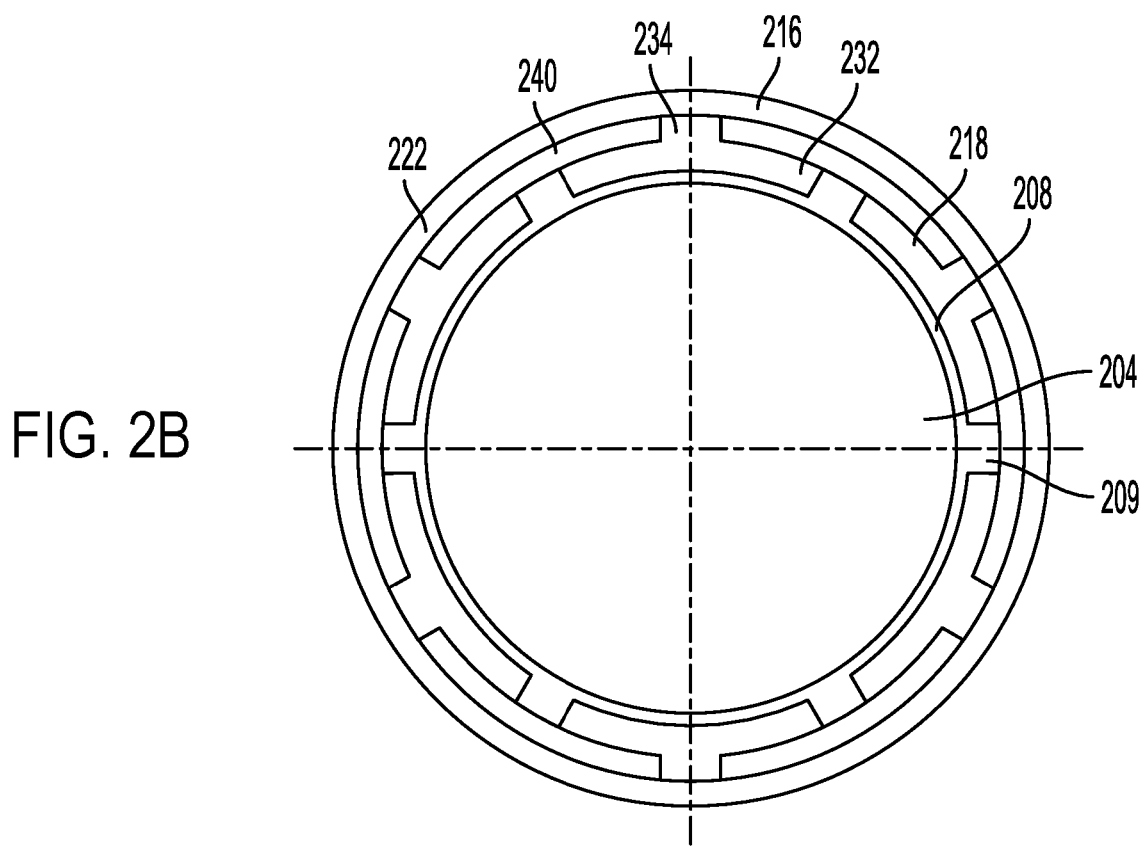
FIG. 2B schematically illustrates a top view of select chamber components of the processing chamber of FIG. 2A.

FIG. 2A schematically illustrates a partial cross-sectional view of select chamber components of an exemplary processing chamber 200. Specifically, FIG. 2A schematically illustrates one half cross-sectional view, e.g., a left half cross-sectional view, of select chamber components of the processing chamber 200. The select chamber components shown may each have axial symmetry about a central axis of the processing chamber 200, and thus may be co-axially aligned about the central axis of the processing chamber 200. Thus, the other half cross-sectional view of the processing chamber 200 may be a mirror image of what is illustrated in FIG. 2. FIG. 2B schematically illustrates a top view of select chamber components of the processing chamber 200 of FIG. 2A.

With reference to FIG. 2A, the processing chamber 200 may include a stepped liner 207 defining at least in part a chamber volume of the processing chamber 200, a metal ring member 210 which may be disposed above and/or supported at least in part by the stepped liner 207, and a substrate support 204 inside the chamber volume. The stepped liner 207, the metal ring member 210, and the substrate support 204 may each be similar to or the same as the stepped liner 107, the metal ring member 110, and the substrate support 104, respectively, described above with reference to FIG. 1. Although a stepped liner is shown, the processing chamber 200 may utilize a flat liner in some embodiments. The processing chamber 200 may further include an edge ring 208 disposed around a peripheral region of the substrate support 204. The edge ring 208 may be similar to or the same as the edge ring 108 described above with reference to FIG. 1. Although not shown, the processing chamber 200 may further include a gas distribution member or showerhead, similar to or the same as the gas distribution member 102 described above with reference to FIG. 1.

With reference to FIGS. 2A and 2B, the processing chamber 200 may also include an outer isolating member 212 (only shown in FIG. 2A) and an inner isolating member 214 coupled with and/or supported by the outer isolating member 212. The inner isolating member 214 may include a first isolating component 216 and a second isolating component 218. The first isolating component 216 may be coupled with and/or supported by the outer isolating member 212, and the second isolating component 218 may be coupled with and/or supported by the first isolating component 216. In some embodiments, the first and second isolating components 216, 218 may be two separate components that may be removably coupled with each other or fixedly attached to each other to form the inner isolating member 214. In some embodiments, the first and second isolating components 216, 218 may be formed as one unitary piece as the inner isolating member 214. The outer isolating member 212 and the inner isolating member 214, e.g., the first and second isolating components 216, 218, may be coaxially aligned with each other about the central axis of the processing chamber 200, and may be collectively referred to as an isolating assembly. The outer isolating member 212, the first isolating component 216, and/or the second isolating component 218 may be made of any insulating material suitable for semiconductor processing, such as a ceramic material, that may electrically isolate or insulate the metal ring member 210 from other chamber components of the processing chamber 200, such as the gas distribution member of the processing chamber 200.

The outer isolating member 212 may be or include an annular or cylindrical member disposed about the central axis the processing chamber 200. The first isolating component 216 may include a cylindrical wall 220, an annular flange or flange 222 extending radially outward from an upper portion, e.g., an upper end, of the cylindrical wall 220, and a number of inwardly extending arms 224 extending radially inward from a lower portion, e.g., a lower end, of the cylindrical wall 220. The flange of the first isolating component 216 may be coupled with and/or supported by an upper portion, e.g., an upper end, of the outer isolating member 212 at an outer portion, e.g., an outer edge, of the flange 222 of the first isolating component 216. Thus, the cylindrical wall 220 of the first isolating component 216 may be radially offset from the outer isolating member 212. A radial gap may be formed between the outer isolating member 212 and the cylindrical wall 220 of the first isolating component 216.

The inwardly extending arms 224 may be circumferentially disposed around the lower portion, e.g., the lower end, of the first isolating component 216. Each of the inwardly extending arms 224 may be spaced apart from two adjacent inwardly extending arms 224 by an equal degree of rotation. For example, in some embodiments, the first isolating component 216 may include six inwardly extending arms 224, and each of the inwardly extending arms 224 may be separated from two adjacent inwardly extending arms 224 by 60° degree of rotation, as measured from a center of each of the inwardly extending arms 224.

The second isolating component 218 may include a cylindrical wall 230, an annular lip or lip 232 extending radially inward from a lower portion, e.g., a lower end, of the cylindrical wall 230, and a number of outwardly extending arms 234 extending radially outward from an upper portion, e.g., an upper end, of the cylindrical wall 230. With further reference to FIG. 2B, the edge ring 208 may include a number of outwardly extending arms 209, such as six outwardly extending arms 209 with each being spaced apart by an equal distance from two adjacent outwardly extending arms 209. In some embodiments, the lip 232 of the second isolating component 218 may be configured to support the edge ring 208 when the substrate support 204 may be lowered. Specifically, the outwardly extending arms 209 of the edge ring 208 may extend radially beyond an inner diameter of the lip 232 of the second isolating component 218. Thus, when the substrate support 204 may be lowered below the second isolating component 218, the edge ring 208 may be lift off from the substrate support 204 by the lip 232 and may rest on the lip 232 of the second isolating component 218. In some embodiments, the lip 232 of the second isolating component 218 and the outwardly extending arms 209 of the edge ring 208 may not overlap radially. For example, the lip 232 may include a smaller inner diameter, and/or the outwardly extending arms 209 may extend radially outward to a lesser degree such that the lip 232 and the outwardly extending arms 209 may not overlap. Thus, the edge ring 208 may not be supported by the second isolating component 218 as the substrate support 204 may be lowered. In some embodiments, the edge ring 208 may be supported by the stepped liner 207 when the substrate support 204 may be further lowered.

The number of the outwardly extending arms 234 of the second isolating component 218 may correspond to the number of the inwardly extending arms 224 of the first isolating component 216. For example, the second isolating component 218 may include six outwardly extending arms 234, and each of the outwardly extending arms 234 may be separated from two adjacent outwardly extending arms 234 by 60° degree of rotation, as measured from a center of each of the outwardly extending arms 234. Each of the outwardly extending arms 234 of the second isolating component 218 may be configured to rest upon, be supported by, and/or coupled with one of the inwardly extending arms 224 of the first isolating component 216 such that the second isolating component 218 may rest upon, be supported by, and/or coupled with the first isolating component 216.

As shown in FIG. 2A, when the second isolating component 218 may be coupled with the first isolating component 216, the cylindrical wall 230 of the second isolating component 218 may be axially offset from the cylindrical wall 220 of the first isolating component 216. Further, as shown in FIGS. 2A and 2B, when the second isolating component 218 may be coupled with the first isolating component 216, the cylindrical wall 230 of the second isolating component 218 may also be radially offset from the first isolating component 216, and may be positioned radially inward from the first isolating component 216. Thus, a number of openings or gaps 240 may be formed by the first and second isolating components 216, 218.

The gaps 240 may be referred to by different names. For examples, the gaps 240 may be referred to as a number of circumferential openings or circumferential gaps 240 that may be formed between adjacent pairs of inwardly extending arms 224 and outwardly extending arms 234. The gaps 240 may also be referred to as a number of radial gaps 240 that may be formed between the cylindrical wall 220 of the first isolating component 216 and the cylindrical wall 230 of the second isolating component 218. The gaps 240 may each have a shape of an annular sector. There may be six gaps 240, and the angle of each of the gaps 240 may be less than or about 60° as measured between adjacent pairs of inwardly extending arms 224 and outwardly extending arms 234, depending on the angle of each of the inwardly extending arms 224 of the first isolating component 216 and/or the outwardly extending arms 234 of the second isolating component 218.

Although each of the first isolating component 216, the second isolating component 218, and the edge ring 208 is described to have six inwardly extending arms 224, six outwardly extending arms 234, and six outwardly extending arms 209, respectively, the first isolating component 216, the second isolating component 218, and/or the edge ring 208 may each include more or less than six arms. For example, the first isolating component 216, the second isolating component 218, and/or the edge ring 208 may each include two, three, four, five, seven, eight, nine, ten, or any number of the respective arms. Additionally, the first isolating component 216, the second isolating component 218, and/or the edge ring 208 may include a common number of arms, or may include different number of arms. In some embodiments, the first isolating component 216 may include one or more arms that may not provide support to any arms of the second isolating component 218, and/or the second isolating component 218 may include one or more arms that may not rest upon any arms of the first isolating component 216. Further, for each of the first isolating component 216, the second isolating component 218, and/or edge ring 208, not every arm may be spaced apart from two adjacent arms by an equal degree of rotation. Some of the arms may be disposed closer to one or both adjacent arms, while some of the arms may be disposed further away from one or both adjacent arms. However, an equal spacing between adjacent arms of each of the first isolating component 216, the second isolating component 218, and/or edge ring 208 may promote uniform gas flow or distribution inside the chamber volume, which may further promote uniform deposition and/or cleaning.

Figure 3A:
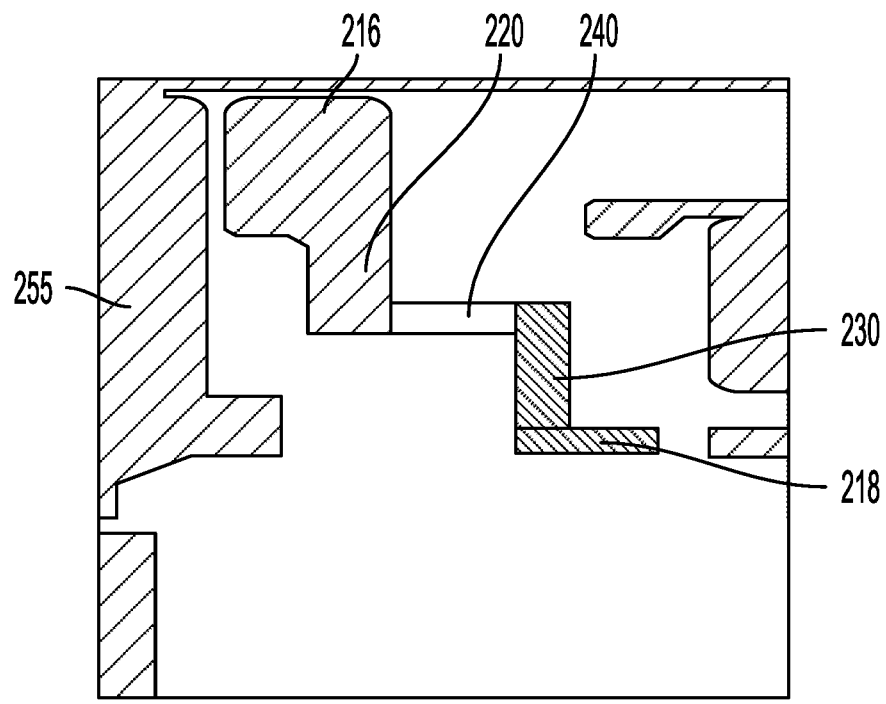
FIGS. 3A and 3B schematically illustrate flow volumes at various regions of the processing chamber of FIGS. 2A and 2B.
Figure 3B:
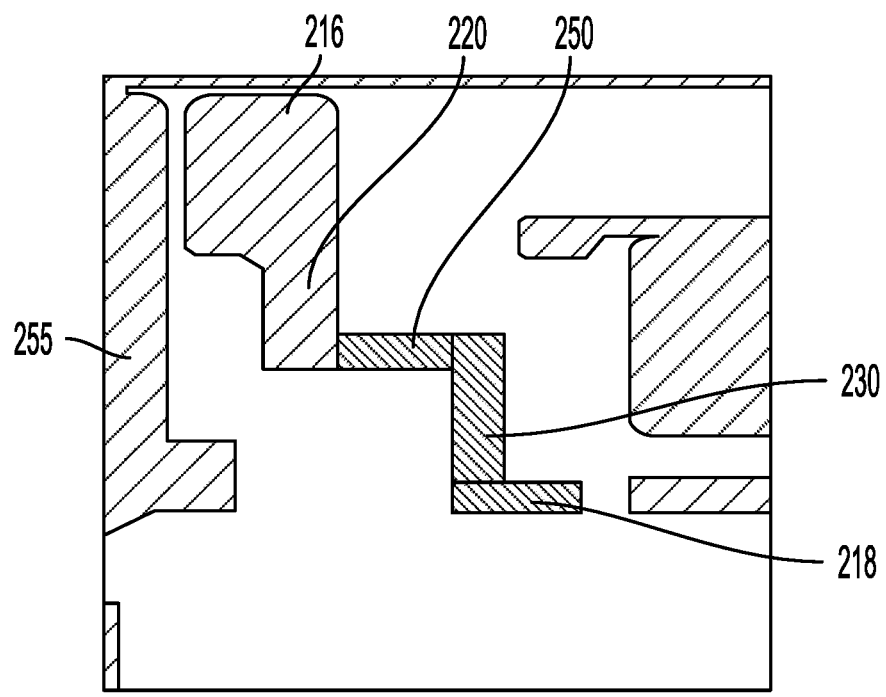

FIG. 3A schematically illustrates flow volumes near one of the gaps 240, and FIG. 3B schematically illustrates flow volumes near one of the pairs of the inwardly extending arms 224 and the outwardly extending arms 234 of the first and second isolating components 216, 218, respectively. Note that, for purpose of illustrating the flow volumes, the pair of the inwardly extending arm 224 and the outwardly extending arm 234 is illustrated as one unitary link 250 in FIG. 3B, and the metal ring member 210 and the outer isolating member 212 are illustrates as one unitary block 255 in FIGS. 3A and 3B.

As shown previously in FIG. 2B, as well as in FIG. 3A, there may be significant circumferential gaps 240 between the pair of arms of the first and second isolating components 216, 218, or significant radial gaps 240 between the cylindrical wall 220 of the first isolating component 216 and the cylindrical wall 230 of the second isolating component 218. The gaps 240 may provide fluid access for a cleaning gas to flow into a radial or annular gap between the second isolating component 218 and the metal ring member 210 (or the lower portion of the block 255 in FIGS. 3A and 3B). Thus, the metal ring member 210 and the outer surface of the second isolating component 218 may be cleaned by the cleaning gas.

Further, the gaps 240 may also allow the cleaning gas to diffuse into a radial or annular gap between the outer isolating member 212 (or the upper portion of the block 255 in FIGS. 3A and 3B) and the first isolating component 216 to clean the outer isolating member 212 and the outer surface of the first isolating component 216. As compared to the embodiment shown in FIG. 1 where the radial gap between the outer isolating member 112 and the inner isolating member 114 may not be accessed by the cleaning gas, the gaps 240 formed between the first and second isolating components 216, 218 may allow the cleaning gas to reach the outer isolating member 212 and the first isolating component 216 to clean these components.

Figure 4:
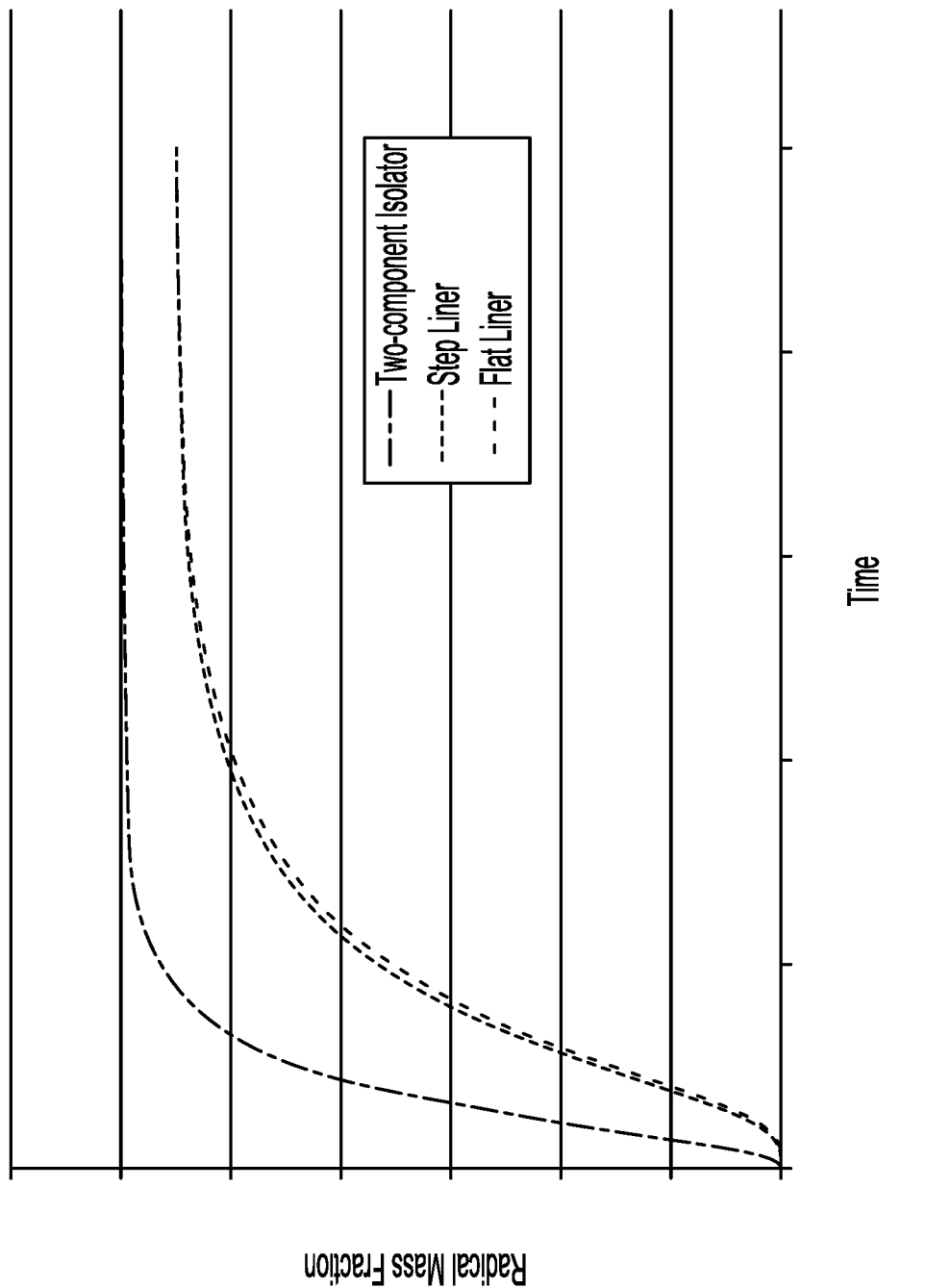
FIG. 4 is a plot showing mass fraction of cleaning gas radicals over time.

FIG. 4 is a plot showing the cleaning gas radical mass fraction, e.g., oxygen radical mass fraction, over time as measured in the annular gap between the outer isolating member 212 and the first isolating component 216. Generally, when the cleaning gas radical mass fraction may reach a plateau, the cleaning of the region of interest may be completed. As shown in FIG. 4, when openings or gaps 240 may be provided by the first and second isolating components 216, 218 to allow the cleaning gas to flow into the annular gap between the outer isolating member 212 and the first isolating component 216, the cleaning gas radial mass fractions may reach a plateau within a much shorter time, as compared to the embodiments where no openings or gaps 240 may be formed in the inner insulator, such as the embodiment shown in FIG. 1 using either a stepped liner or a flat liner. Further, when openings or gaps 240 may be provided by the first and second isolating components 216, 218, the mass fraction of the cleaning gas radical inside the annular gap between the outer isolating member 212 and the first isolating component 216 may also be much higher, as compared to embodiments where no openings or gaps 240 may be formed in the inner insulator.

Thus, by providing openings or gaps 240 between the first and second isolating components 216, 218, more efficient cleaning or shorter cleaning cycle may be achieved. In some embodiments, by providing openings or gaps 240 between the first and second isolating components 216, 218, the cleaning may be reduced by at least 50%, at least 60%, at least 70%, at least 80%, or more, as compared to embodiments where no openings or gaps 240 may be formed in the inner insulator. For example, by providing openings or gaps 240 between the first and second isolating components 216, 218, the outer isolating member 212 and the first isolating component 216 may be cleaned within less than 0.5 seconds, less than 0.4 seconds, less than 0.3 seconds, or less.

Moreover, when openings or gaps 240 may be provided between the first and second isolating components 216, 218, the cleaning gas flow may continuously reach and clean the outer isolating member 212 and/or the metal ring member 210 as the substrate support 204 may be moved downward until the substrate support 204 may be moved below the step of the stepped liner 207. Thus, when the substrate support 204 may be level with the step of the stepped liner 207 or at a higher position, the cleaning gas may continuously flow through the gaps 240 into the annular gap between the metal ring member 210 and the first or second isolating component 216, 218 and into the annular gap between the outer isolating member 212 and the first or second isolating component 216, 218 to clean the metal ring member 210, the outer isolating member 212, and the outer surfaces of the first and second isolating components 216, 218.

Although in FIG. 3B, direct flow toward the metal ring member 210 may be affected by the presence of the pairs of arms of the first and second isolating components 216, 218 (or link 250 in FIG. 3B), the cleaning gas flowed through the gaps 240 may nonetheless reach the portions of the metal ring member 210 radially aligned with the pair of arms of the first and second isolating components 216, 218 at relatively high concentration to achieve effective cleaning of the entire metal ring member 210.

In some embodiments, to limit or minimize the effect of the pair of arms of the first and second isolating components 216, 218, the angular span or the angle of the arms of the first and second isolating components 216, 218 may be relatively small so as to keep the gaps 240 relatively large. For example, the collective angle of all the gaps 240 may be greater than or about 180°, greater than or about 210°, greater than or about 240°, greater than or about 270°, greater than or about 300°, greater than or about 330°, or close to 360°. In some embodiments, the first and second isolating components 216, 218 may collectively define six equally divided circumferential gaps 240, and the angle of each gap 240 may be greater than or about 30°, greater than or about 35°, greater than or about 40°, greater than or about 45°, greater than or about 50°, greater than or about 55°, or close to 60°. In some embodiments, the first and second isolating components 216, 218 may collectively define less than six equally divided circumferential gaps 240, and the angle of each gap 240 may be greater than or about 60°, greater than or about 70°, greater than or about 80°, greater than or about 90°, greater than or about 100°, greater than or about 120°, greater than or about 140°, greater than or about 160°, or close to 180°. In some embodiments, the first and second isolating components 216, 218 may collectively define more than six equally divided circumferential gaps 240, the angle of each gap 240 may be greater than or about 5°, greater than or about 10°, greater than or about 15°, greater than or about 20°, greater than or about 25°, greater than or about 30°, greater than or about 35°, greater than or about 40°, greater than or about 45°, greater than or about 50°, or greater. In some embodiments, the circumferential gaps 240 may not be equally divided. The angles of the circumferential gaps 240 may vary. In some embodiments, the angle of each circumferential gaps 240 may range between about 5° and about 355°, between about 15° and about 300°, between about 30° and about 240°, between about 45° and about 180°, or between about 60° and about 120°.

Further, to facilitate flow of the cleaning gas through the gaps 240, the width or radial extension of the gaps 240, as measured between the inner surface of the cylindrical wall 220 of the first isolating component 216 and the outer surface of the cylindrical wall 230 of the second isolating component 218, may be greater than or about 2 mm, greater than or about 3 mm, greater than or about 4 mm, greater than or about 5 mm, greater than or about 6 mm, greater than or about 7 mm, greater than or about 8 mm, greater than or about 9 mm, greater than or about 10 mm, greater than or about 11 mm, greater than or about 12 mm, greater than or about 13 mm, greater than or about 14 mm, greater than or about 15 mm, or greater.

With continued reference to FIGS. 3A and 3B, at least the second isolating component 218 may be positioned radially inward from the metal ring member 210, and in some embodiments, at least a portion of the cylindrical wall 230 of the second isolating component 218 may be radially aligned with the metal ring member 210. Thus, the metal ring member 210 may be shielded by at least the second isolating component 218 to protect the metal ring member 210 from plasma that may be flowed into or generated inside the processing chamber during deposition. In some embodiments, at least a portion of the first isolating component 216, such as a portion of the cylindrical wall 220 of the first isolating component 216 may be radially aligned with the metal ring member 210. The cylindrical wall 220 of the first isolating component 216 may then protect the metal ring member 210 from any plasma damage. Thus, the two-piece or two-component design of the inner isolating member 214 may shield the metal ring member 210 from plasma during process while still allowing for efficient and effectively cleaning of the metal ring member 210 by providing a number of openings or gaps 240 between the first and second isolating components 216, 218 of the inner isolating member 214.

Figure 5:
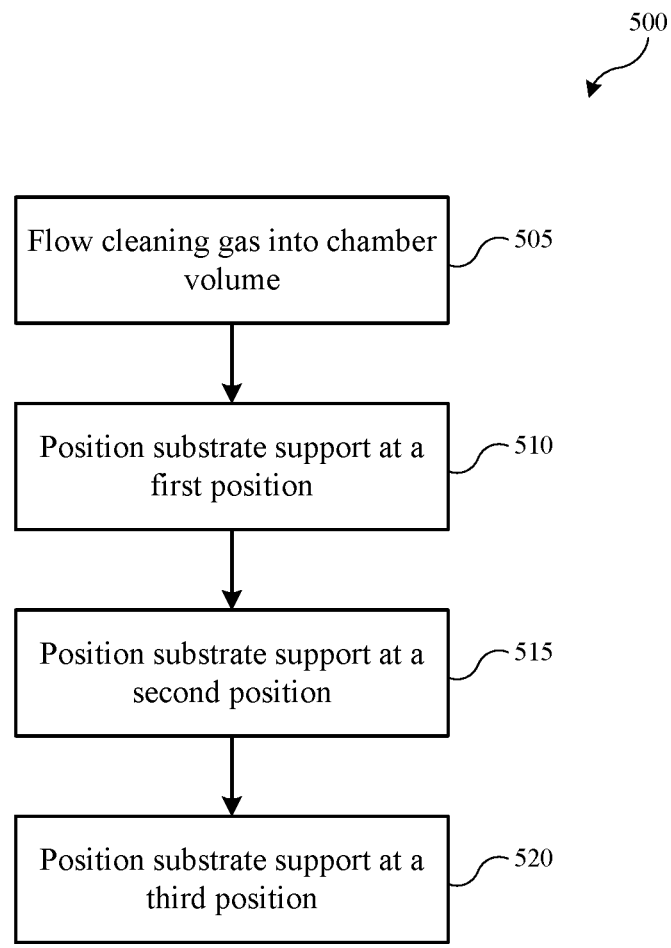
FIG. 5 shows exemplary operations in a method of cleaning chamber components of the processing chamber of FIGS. 2A and 2B.
Figure 6A:
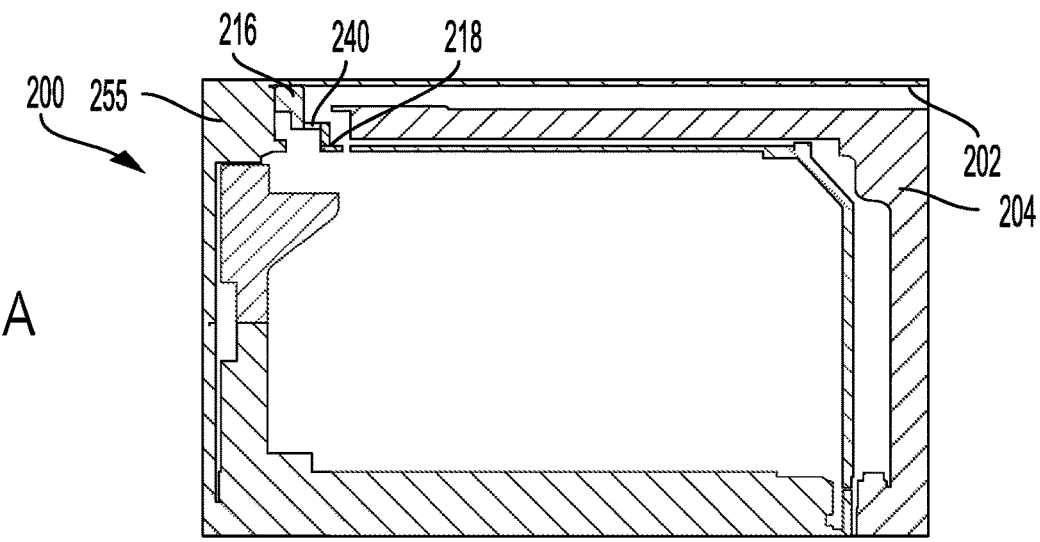
FIGS. 6A, 6B, and 6C schematically illustrate flow volumes of the processing chamber of FIGS. 2A and 2B while one or more operations of method of FIG. 5 may be performed.
Figure 6B:
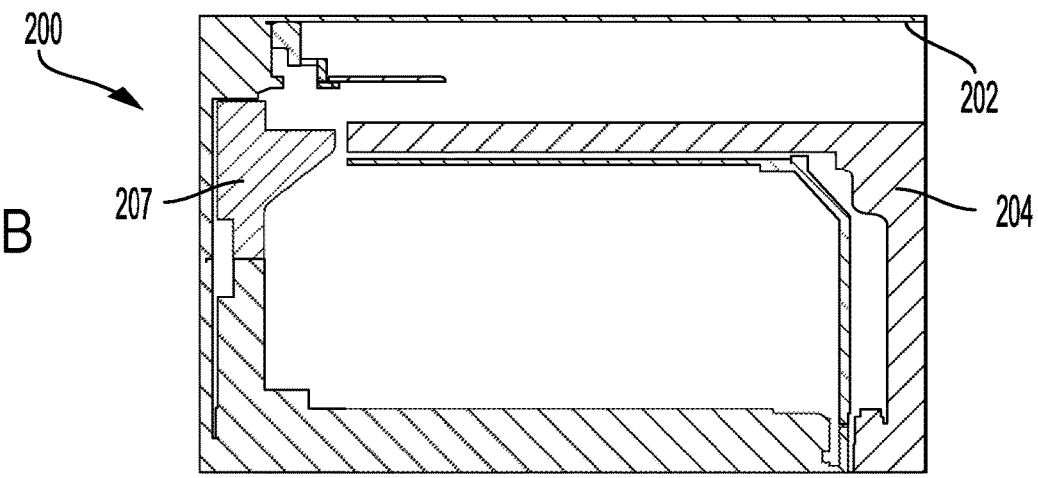
Figure 6C:
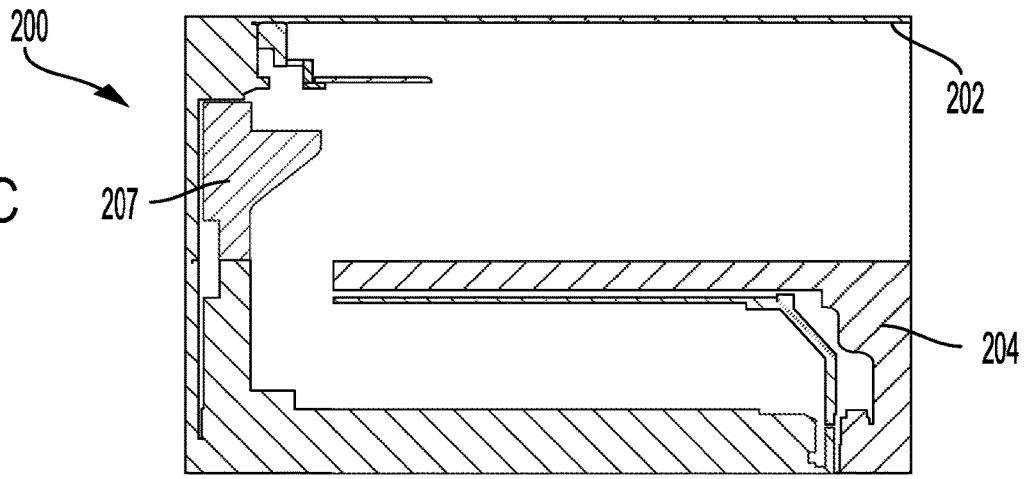

FIG. 5 shows exemplary operations in a method 500 of cleaning chamber components of the processing chamber 200. FIGS. 6A, 6B, and 6C schematically illustrate flow volumes of the processing chamber while various operations of method 500 may be performed. Method 500 may implement a multi-stage cleaning process to create different cleaning gas flow profile at each stage so as to direct the cleaning gas towards various chamber components at different cleaning stages.

Method 500 may begin by flowing a cleaning gas into the processing volume of the processing chamber 200 at operation 505. The cleaning gas may be delivered into the processing volume by a gas distribution member 202 (shown in FIGS. 6A-6C) of the processing chamber 200. The cleaning gas may include plasma effluents that may be generated in a remote plasma source or unit that may be fluidly coupled with the processing chamber 200 and then flowed into the processing chamber 200 from the remote plasma source or unit. In some embodiments, the plasma effluents may be generated locally in the processing chamber 200, such as a capacitively coupled plasma generated inside the processing chamber 200.

At operation 510, the substrate support 204 may be positioned at a first position as shown in FIG. 6A such that a first gap between the gas distribution member 202 and the substrate support 204 may be maintained. The first gap may be the same as or similar to the gap typically maintained during a deposition process. In some embodiments, the first gap may range between 100 mils (or thousandths of inch) and 700 mils, such as between 200 mils and 600 mils, between 300 mils and 500 mils, and may be about 100 mils, about 200 mils, about 300 mils, about 400 mils, about 500 mils, about 600 mils, or about 700 mils in embodiments.

When the substrate support 204 may be moved to the first position, the cleaning gas may flow from the gas distribution member 202 towards the radial edge of the substrate support 204, and then flow towards the first and second isolating components 216, 218 and through the gaps 240 defined by the first and second isolating components 216, 218 to clean the first and second isolating components 216, 218, as well as the outer isolating member 212 and the metal ring member 210 as discussed above (collectively shown as block 255 in FIG. 6A).

Once the first and second isolating components 216, 218, the outer isolating member 212, and the metal ring member 210 may be sufficiently cleaned, at operation 515, the substrate support 204 may be lowered from the first position to a second position as shown in FIG. 6B such that a second gap between the gas distribution member 202 and the substrate support 204 may be maintained. At the second position, the substrate support 204 may be level with the step of the stepped liner 207. The second gap may range between 1000 mils and 3000 mils, such as between 1250 mils and 2750 mils, between 1500 mils and 2500 mils, between 1750 mils and 2250 mils, and may be about 1000 mils, about 1250 mils, about 1500 mils, about 1750 mils, about 2000 mils, about 2250 mils, about 2500 mils, about 2750 mils, or about 3000 mils in embodiments. When the substrate support 204 may be moved to the second position, the flow of the cleaning gas may be directed toward the stepped liner 207, including the slanted, downward facing surface of the stepped liner 207, and other nearby chamber components to clean those chamber components.

Once the stepped liner 207 may be sufficiently cleaned, at operation 520, the substrate support 204 may be lowered from the second position to a third position as shown in FIG. 6C such that a third gap between the gas distribution member 202 and the substrate support 204 may be maintained. The third gap may range between 3000 mils and 5500 mils, such as between 3500 mils and 5000 mils, between 4000 mils and 4500 mils, and may be about 3000 mils, about 3250 mils, about 3500 mils, about 3750 mils, about 4000 mils, about 4250 mils, about 4500 mils, about 4750 mils, about 5000 mils, about 5250 mils, or about 5500 mils in embodiments. When the substrate support 204 may be moved to the third position, the flow of the cleaning gas may be directed toward the chamber wall below the stepped liner 207, the bottom of the chamber body, as well as the underside of the substrate support 204.

Although method 500 illustrates an exemplary cleaning scheme where the substrate support 204 may be moved to different positions and maintained at the respective positions to clean various chamber components, the substrate support 204 may be moved in a continuous manner gradually from the first position to the third position to clean the various chamber components. As discussed above, with the gaps 240 provided by the first and second isolating components 216, 218, until the substrate support 204 may be moved below the step of the stepped liner 207, the cleaning gas may be continuously delivered through the gaps 240 into the annular gap between the outer isolating member 212 and the first and/or second isolating components 216, 218 and the annular gap between the metal ring member 210 and the first and/or second isolating components 216, 218. Thus, effective cleaning of the metal ring member 210 and the outer and inner isolating members 212, 214 may be achieved.

Once the various chamber components may be cleaned, the flow of the cleaning gas may be stopped, and the substrate support 204 may be moved to a position closer to the gas distribution member 202, such as the position shown in FIG. 6A or any other suitable position, for performing a deposition process. During the deposition process, a plasma, such as an inductively coupled plasma, may be formed inside the processing chamber between the gas distribution member 202 and the substrate support 204. With the isolating assembly described herein, the metal ring member 210 may be shielded from the plasma and thus protected from any damage that may be created by the plasma.

Figure 7A:
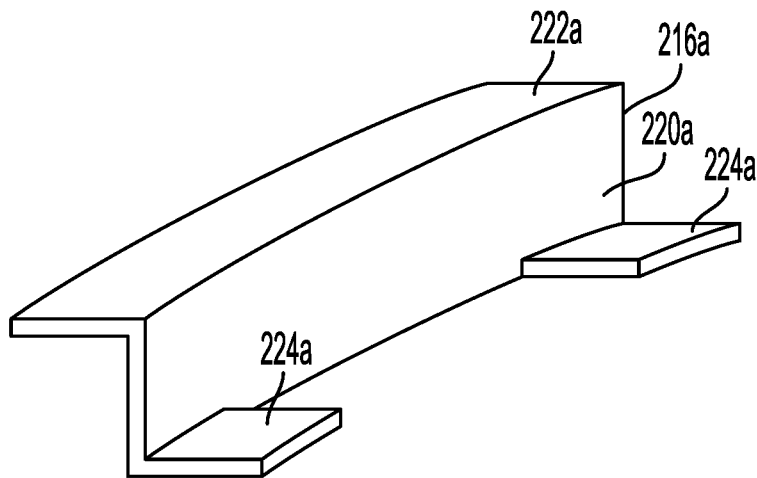
FIGS. 7A, 7B, and 7C schematically illustrate one embodiment of an inner isolating member according to embodiments of the present technology.
Figure 7B:
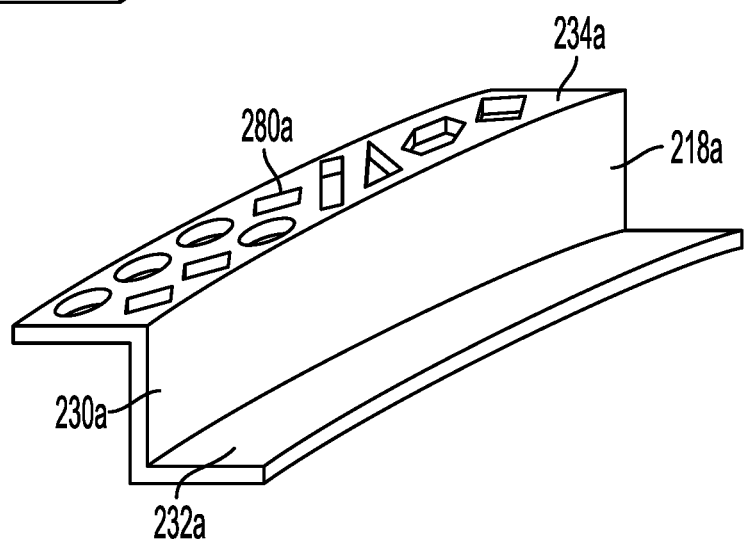
Figure 7C:
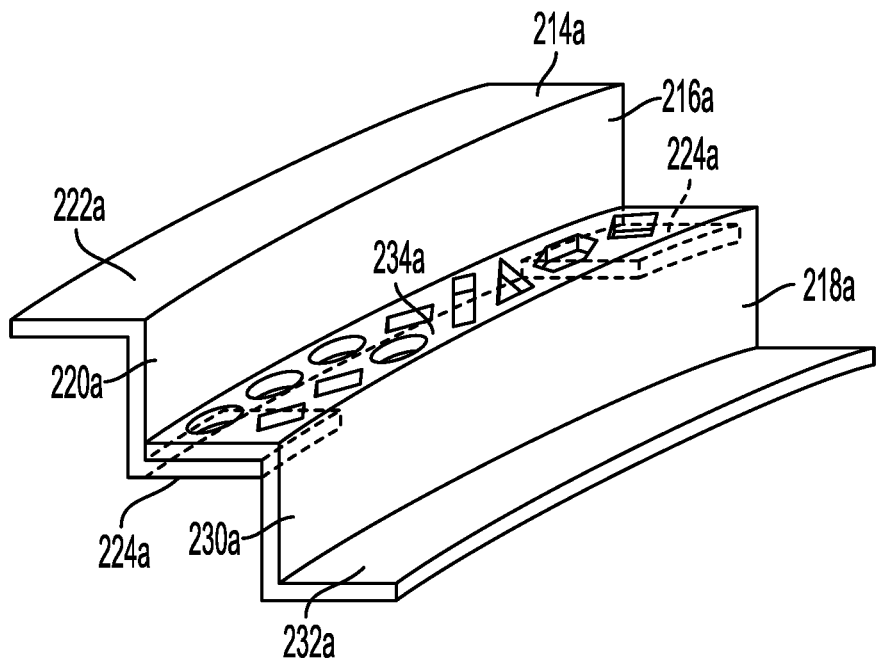

FIGS. 7A, 7B, and 7C schematically illustrate another embodiment of an inner isolating member 214a (labeled in FIG. 7C) according to embodiments of the present technology. The inner isolating member 214a may be configured, and/or may operate and/or function, in a manner similar to the inner isolating member 214 described above. The inner isolating member 214 may include a first isolating component 216a (shown in FIGS. 7A and 7C) and a second isolating component 218a (shown in FIG. 7B and 7C). It should be noted that FIGS. 7A and 7B illustrate only a portion of the first isolating component 216a and a portion of the second isolating component 218a, respectively, and that FIG. 7C illustrates only a portion of the inner isolating member 214a or the assembled first and second isolating components 216a, 218a. The first and/or second isolating components 216a, 218a may each include a circular body, such as a cylindrical wall, similar to the cylindrical walls 220, 230 of the first and/or second isolating components 216, 218 described above.

Specifically, similar to the first isolating component 216 described above, the first isolating component 216a shown in FIG. 7A may include a cylindrical wall 220a, an annular flange or flange 222a extending radially outward from an upper portion, e.g., an upper end, of the cylindrical wall 220a, and a number of inwardly extending arms 224a extending radially inward from a lower portion, e.g., a lower end, of the cylindrical wall 220a.

Similar to the second isolating component 218 described above, the second isolating component 218a shown in FIG. 7B may include a cylindrical wall 230a and an annular lip or lip 232a extending radially inward from a lower portion, e.g., a lower end, of the cylindrical wall 230a. Different from the second isolating component 218 described above, the second isolating component 218a may include an annular flange or flange 234a, instead of a number of outwardly extending arms 234, extending radially outward from an upper portion, e.g., an upper end, of the cylindrical wall 230a. The flange 234a may extend around the entire periphery of the upper end of the cylindrical wall 230a. The flange 234a may include a number of openings, holes, slots, or apertures 280a to provide fluid access to the gap or cavity between the metal ring member 210 and the inner isolating member 214a or the assembled first and second isolating components 216a, 218a.

In some embodiments, the openings, holes, slots, or apertures 280a may have a common shape and/or size and may be uniformly distributed throughout the flange 234a. In some embodiments, the openings, holes, slots, or apertures 280a may have varying shapes and/or varying sizes. The openings, holes, slots, or apertures 280a may have a circular, oval, triangular, square, rectangular, diamond, pentagonal, hexagonal, or any other suitable shape. In some embodiments, the flange 234a may be or include a wire mesh made of and/or coated with an insulating material, such as a ceramic material. The wire mesh may have sufficient structural strength to rest upon the inwardly extending arms 224a of the first isolating component 216a to support the second isolating component 218a while providing fluid access to the gap or cavity between the metal ring member 210 and the inner isolating member 214a.

Figure 8A:
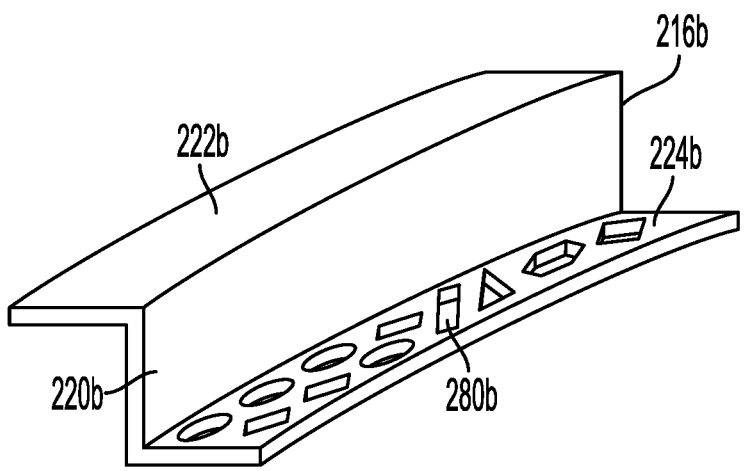
FIGS. 8A, 8B, and 8C schematically illustrate a further embodiment of an inner isolating member according to embodiments of the present technology.
Figure 8B:
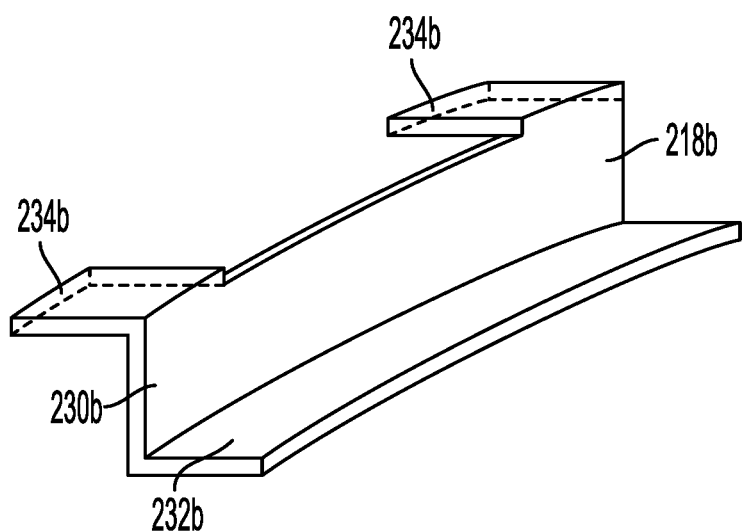
Figure 8C:
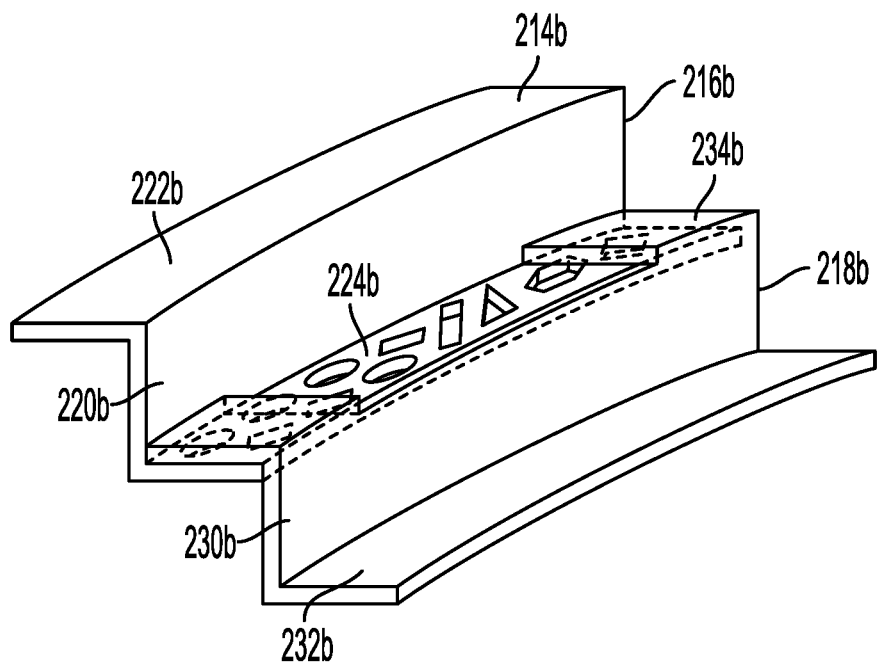

FIGS. 8A, 8B, and 8C schematically illustrate another embodiment of an inner isolating member 214b (labeled in FIG. 8C) according to embodiments of the present technology. The inner isolating member 214b may be configured, and/or may operate and/or function, in a manner similar to the inner isolating members 214, 214a described above. The inner isolating member 214b may include a first isolating component 216b (shown in FIGS. 8A and 8C) and a second isolating component 218b (shown in FIGS. 8B and 8C). It should be noted that, similar to FIGS. 7A-7C, FIGS. 8A and 8B illustrate only a portion of the first isolating component 216b and a portion of the second isolating component 218b, respectively, and that FIGS. 8C illustrates only a portion of the inner isolating member 214b or the assembled first and second isolating components 216b, 218b. The first and/or second isolating components 216b, 218b may each include a circular body, such as a cylindrical wall, similar to the cylindrical walls 220, 230, 220a, 230a of the first and/or second isolating components 216, 218, 216a, 218a described above.

Specifically, similar to the second isolating component 218, the second isolating component 218b shown in FIG. 8B may include a cylindrical wall 230b, an annular lip or lip 232b extending radially inward from a lower portion, e.g., a lower end, of the cylindrical wall 230b, and a number of outwardly extending arms 234b extending radially outward from an upper portion, e.g., an upper end, of the cylindrical wall 230b.

Similar to the first isolating component 216, the first isolating component 216b shown in FIG. 8A may include a cylindrical wall 220b and an annular flange or flange 222b extending radially outward from an upper portion, e.g., an upper end, of the cylindrical wall 220b. Different from the first isolating component 216, the first isolating component 216b may include an annular lip or lip 224b, instead of a number of inwardly extending arms 224, extending radially inward from a lower portion, e.g., a lower end, of the cylindrical wall 220b. The lip 224b may extend around the entire periphery of the lower end of the cylindrical wall 220b. The lip 224b may include a number of openings, holes, slots, or apertures 280b to provide fluid access to the gap or cavity between the metal ring member 210 and the inner isolating member 214b or the assembled first and second isolating components 216b, 218b.

Similar to the openings, holes, slots, or apertures 280a, in some embodiments, the openings, holes, slots, or apertures 280b may have a common shape and/or size and may be uniformly distributed throughout the lip 224b, while in some embodiments, the openings, holes, slots, or apertures 280b may have varying shapes and/or varying sizes. The openings, holes, slots, or apertures 280b may have a circular, oval, triangular, square, rectangular, diamond, pentagonal, hexagonal, or any other suitable shape. Similar to the flange 234a of the second isolating component 218a, in some embodiments, the lip 224b of the first isolating component 216b may be or include a wire mesh made of and/or coated with an insulating material, such as a ceramic material. The wire mesh may have sufficient structural strength to support the second isolating component 218b by supporting the outwardly extending arms 234b of the second isolating component 218b.

Figure 9:
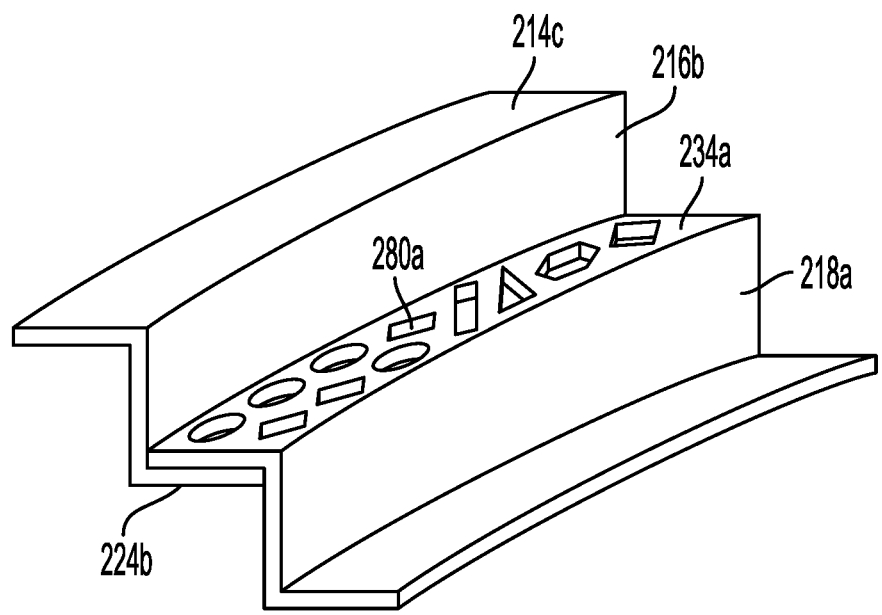
FIG. 9 schematically illustrates another embodiment of an inner isolating member according to embodiments of the present technology.

FIG. 9 schematically illustrates another embodiment of an inner isolating member 214c according to embodiments of the present technology. The inner isolating member 214c may include the first isolating component 216b described above with reference to FIG. 8A and the second isolating component 218a described above with reference to FIG. 7B. Thus, when the first isolating component 216b and the second isolating component 218a may be assembled, at least some of the openings, holes, slots, or apertures 280a formed in the flange 234a of the second isolating component 218a may be aligned with at least some of the openings, holes, slots, or apertures 280b (not shown in FIG. 9) formed in the lip 224b of the first isolating component 216b to provide fluid access to the gap or cavity between the metal ring member 210 and the inner isolating member 214c or the assembled first and second isolating components 216b, 218a.

In some embodiments, the pattern or the shape and/or size of the openings, holes, slots, or apertures 280b of the lip 224b of the first isolating component 216b may be the same as or similar to the pattern or the shape and/or size of the openings, holes, slots, or apertures 280a of the flange 234a of the second isolating component 218a. When the first isolating component 216b and the second isolating component 218a may be assembled, substantially all or a majority, such as greater than or about 50%, greater than or about 60%, greater than or about 70%, greater than or about 80%, greater than or about 90%, greater than or about 95% of the openings, holes, slots, or apertures 280a, 280b may be aligned.

In some embodiments, the pattern or the shape and/or size of the openings, holes, slots, or apertures 280b of the lip 224b of the first isolating component 216b may be different from the pattern or the shape and/or size of the openings, holes, slots, or apertures 280a of the flange 234a of the second isolating component 218a. Nonetheless, through-holes defined by the overlapping openings, holes, slots, or apertures 280a, 280b of the lip 224b of the first isolating component 216b and the flange 234a of the second isolating component 218a may still provide sufficient fluid access to the gap or cavity between the metal ring member 210 and the inner isolating member 214c. In some embodiments, the through-holes may define greater than or about 50%, greater than or about 60%, greater than or about 70%, greater than or about 80%, greater than or about 90%, greater than or about 95% of the overlapping area of the lip 224b of the first isolating component 216b and the flange 234a of the second isolating component 218a.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A processing chamber, comprising:
   a gas distribution member;
   a metal ring member below the gas distribution member; and
   an isolating assembly coupled with the metal ring member and isolating the metal ring member from the gas distribution member, wherein the isolating assembly comprises:
      an outer isolating member coupled with the metal ring member, wherein the outer isolating member at least in part defines a chamber wall; and
      an inner isolating member coupled with the outer isolating member, wherein the inner isolating member is disposed radially inward from the metal ring member about a central axis of the processing chamber, and wherein the inner isolating member defines a plurality of openings configured to provide fluid access into a radial gap between the metal ring member and the inner isolating member.

2. The processing chamber of claim 1, wherein a portion of the inner isolating member is radially aligned with the metal ring member.

3. The processing chamber of claim 1, wherein the inner isolating member comprises:
   a first inner isolating component coupled with the outer isolating member; and
   a second inner isolating component coupled with the first inner isolating component and coaxially aligned with the first inner isolating component, wherein the second inner isolating component is axially offset from the first inner isolating component and is disposed radially inward from the first inner isolating component to define the plurality of openings.

4. The processing chamber of claim 3, wherein the plurality of openings comprise a plurality of circumferential gaps, wherein the first inner isolating component comprises a first cylindrical wall and a plurality of first arms extending radially inward from a bottom portion of the first cylindrical wall, wherein the second inner isolating component comprises a second cylindrical wall and a plurality of second arms extending radially outward from a top portion of the second cylindrical wall, wherein the plurality of second arms are coupled with the plurality of first arms, and wherein the plurality of circumferential gaps are defined between the coupled plurality of first and second arms.

5. The processing chamber of claim 4, wherein the second inner isolating component further comprises a lip extending radially inward from a bottom portion of the second cylindrical wall, and wherein the lip is configured to support an edge ring of a substrate support of the processing chamber.

6. The processing chamber of claim 1, wherein an angle of each opening of the plurality of openings is greater than or about 5°.

7. The processing chamber of claim 1, wherein the outer isolating member comprises an isolating ring coaxially aligned with the metal ring member about the central axis of the processing chamber.

8. The processing chamber of claim 1, wherein the gas distribution member, the metal ring member, and the isolating assembly are coaxially aligned about the central axis of the processing chamber.

9. An isolating assembly, comprising:
   an annular outer isolating member disposed about a central axis of the isolating assembly; and
   an inner isolating member coaxially aligned with the annular outer isolating member about the central axis, wherein the inner isolating member comprises:
      a first isolating component comprising:
         a first cylindrical wall; and
         a plurality of first arms extending radially inward from a lower portion of the first cylindrical wall;
      a second isolating component comprising:
         a second cylindrical wall coaxially aligned with the first cylindrical wall and axially offset from the first cylindrical wall; and
         a plurality of second arms extending radially outward from an upper portion of the second cylindrical wall, wherein the plurality of second arms are coupled with the plurality of first arms, and wherein a plurality circumferential gaps are defined between the coupled plurality of first and second arms.

10. The isolating assembly of claim 9, wherein each of the plurality of first arms is disposed at an equal distance from two adjacent first arms, and wherein each of the plurality of second arms is disposed at an equal distance from two adjacent second arms.

11. The isolating assembly of claim 9, wherein a number of the plurality of first arms and a number of the plurality of second arms are equal.

12. The isolating assembly of claim 9, wherein at least one of the annular outer isolating member, the first isolating component, or the second isolating component comprises a ceramic material.

* * * * *

UNITED STATES PATENT AND TRADEMARK OFFICE
CERTIFICATE OF CORRECTION

| | |
|---|---|
| PATENT NO. | : 11,532,463 B2 |
| APPLICATION NO. | : 16/936071 |
| DATED | : December 20, 2022 |
| INVENTOR(S) | : Vishwas Kumar Pandey et al. |

It is certified that error appears in the above-identified patent and that said Letters Patent is hereby corrected as shown below:

In the Claims

Column 18, Line 33, Claim 9: after "plurality" insert -- of --.

Signed and Sealed this
Twelfth Day of March, 2024

*Katherine Kelly Vidal*

Katherine Kelly Vidal
*Director of the United States Patent and Trademark Office*